US010763638B2

(12) United States Patent
Jungwirth et al.

(10) Patent No.: US 10,763,638 B2
(45) Date of Patent: Sep. 1, 2020

(54) TRANSISTOR OUTLINE HOUSINGS FOR DISTRIBUTED FEEDBACK LASERS

(71) Applicant: SCHOTT AG, Mainz (DE)

(72) Inventors: Rudolf Jungwirth, Adikofen (DE); Amy Soon Li Ping, Singapore (SG); Artit Aowudomsuk, Bangkok (TH); Ong Wai Li, Singapore (SG); Kenneth Tan, Singapore (SG); Karsten Droegemueller, Eichenau (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 16/119,571

(22) Filed: Aug. 31, 2018

(65) Prior Publication Data

US 2019/0074658 A1  Mar. 7, 2019

(30) Foreign Application Priority Data

Sep. 1, 2017  (DE) .......................... 10 2017 120 216

(51) Int. Cl.
| | | |
|---|---|---|
| *H01S 5/022* | (2006.01) | |
| *H01S 5/024* | (2006.01) | |
| *H01S 5/12* | (2006.01) | |
| *H01S 5/062* | (2006.01) | |

(52) U.S. Cl.
CPC ...... *H01S 5/02212* (2013.01); *H01S 5/02248* (2013.01); *H01S 5/02276* (2013.01); *H01S 5/02415* (2013.01); *H01S 5/12* (2013.01); *H01S 5/06226* (2013.01)

(58) Field of Classification Search
CPC ............ H01S 5/02212; H01S 5/02248; H01S 5/02276; H01S 5/02415; H01S 5/12
See application file for complete search history.

(56) References Cited

U.S. PATENT DOCUMENTS

| 7,962,044 B2 | 6/2011 | McCallion |
| 2003/0043868 A1 | 3/2003 | Stewart |
| 2005/0121684 A1 | 6/2005 | Aruga |
| 2005/0201433 A1* | 9/2005 | Riaziat ............... H01S 5/02212 372/36 |
| 2012/0045161 A1 | 2/2012 | Okada |
| 2012/0328229 A1 | 12/2012 | Kogo |
| 2014/0141535 A1 | 5/2014 | Lu et al. |
| 2014/0328595 A1 | 11/2014 | Han |
| 2016/0036192 A1* | 2/2016 | Serbicki ............. H01S 5/02256 29/879 |

(Continued)

FOREIGN PATENT DOCUMENTS

| JP | 2001257415 | 9/2001 |
| JP | 2003037329 | 2/2003 |
| JP | 2004047830 | 2/2004 |

(Continued)

*Primary Examiner* — Armando Rodriguez
(74) *Attorney, Agent, or Firm* — Ohlandt, Greeley, Ruggiero & Perle, L.L.P.

(57) ABSTRACT

A transistor outline (TO) housing comprising a base part having a mounting area for a thermoelectric cooler, wherein the base part has at least two feedthroughs for connecting an optoelectronic component. A support extends from the upper surface of the base part, which support has at least two conductor traces arranged thereon, each of which is connected to a respective one of the feedthroughs for connecting the optoelectronic component.

19 Claims, 3 Drawing Sheets

(56) References Cited

U.S. PATENT DOCUMENTS

2017/0133821 A1\* 5/2017 Kimura ................ H01S 5/0264

FOREIGN PATENT DOCUMENTS

| JP | 2004063852 | 2/2004 |
| JP | 2011108939 | 6/2011 |
| JP | 2011197360 | 10/2011 |
| JP | 2013008887 | 1/2013 |
| JP | 2016012601 | 1/2016 |

\* cited by examiner

US 10,763,638 B2

TRANSISTOR OUTLINE HOUSINGS FOR DISTRIBUTED FEEDBACK LASERS

CROSS REFERENCE TO RELATED APPLICATIONS

This application claims benefit under 35 USC § 119 of German Application 102017120216.1 filed Sep. 1, 2018, the entire contents of which are incorporated herein by reference.

BACKGROUND

1. Field of the Invention

The invention relates to a housing for an optoelectronic component. More particularly, the invention relates to a transistor outline housing which is intended for a distributed feedback (DFB) laser.

2. Description of Related Art

Since the emission wavelength of semiconductor lasers is temperature-dependent, it is important for many applications to keep the temperature of the laser chip within a narrow window.

For this purpose, thermoelectric coolers (TECs) are used, which are installed together with the laser in a so-called transistor outline housing (TO housing), also known as TO package.

Such TECs are often used in combination with Externally Modulated Lasers (EML). EMLs only need one signal line. However, EMLs are complex and expensive as an electronic component.

Therefore, Distributed Feedback Lasers (DFB lasers) have been used as an alternative. These are laser diodes in which the active material exhibits a periodic pattern so as to form an interference grating which causes wavelength-selective reflection and hence optical feedback of the laser.

Housings designed for EMLs are generally not eligible for a DFB laser since they only have one signal line which, moreover, usually has an impedance not suitable for a DFB laser.

Patent document U.S. Pat. No. 7,962,044 B2 discloses a housing for an optoelectronic device, which is designed as a cuboid metal housing with lateral signal inputs. Such housings are large and moreover expensive to manufacture.

Published patent application U.S. 2003/0043868 A1 discloses a TO housing with a base part having connection pins projecting downwards. The substantially circular-cylindrical housing has a central recess in which a TEC and a laser chip can be mounted. A drawback of this housing design, again, is its complicated manufacture. In particular, such a housing cannot be produced by stamping or deep drawing.

SUMMARY

Given the above, the invention is based on the object to provide a compact and easy-to-manufacture TO housing in which the drawbacks of the prior art as described above are at least mitigated.

The object of the invention is achieved by a TO housing, a method for producing a TO housing, and by a sub-mount for a TO housing as disclosed herein.

The invention relates to a TO housing. More particularly, the invention relates to a TO-56 housing. A TO housing in the sense of the invention is understood to mean a housing of any desired design in which an optoelectronic component for transmitting and/or receiving electromagnetic radiation can be arranged. Preferably, this is a housing comprising a header which defines a base part, and a cap, in particular a cap having a window. In particular, the TO housing is designed as a circular metal housing. According to another embodiment, the housing may as well have a different shape, in particular a cuboid shape.

The housing comprises a base part with a mounting area for a thermoelectric cooler. The mounting area is in particular provided on an upper surface of the base part.

Furthermore, the base part comprises at least two feedthroughs for connecting an electronic component. These at least two feedthroughs are used as signal lines, in particular for a high-frequency signal in the GHz range.

More particularly, the feedthroughs comprise connection pins which are secured, by glass seals, in through-holes in the base part so that the connection pins protrude from the lower surface of the TO housing.

It will be understood that the base part preferably comprises further electrical feedthroughs, in particular for connecting the TEC. Further connection lines may be used to connect a thermistor, for example.

The connection lines that are used as a signal line provided for the optoelectronic component, in particular for the DFB laser, need to be designed so as to enable transmission in the high frequency range, since this is the only way to enable high data rates. The other connection lines, even if they serve as signal lines, for example for controlling the TEC, are usually not subject to such requirements.

According to the invention, a support extends from the upper surface of the base part, which support has at least two conductor traces arranged thereon, each of which is connected to a respective one of the feedthroughs for connecting the optoelectronic component.

In particular, the support comprises a sub-mount on which the at least two conductor traces are disposed. Relative to a surface of the base part, the conductor traces preferably extend vertically upward in sections thereof.

The conductor traces are preferably provided in the form of metal layers deposited on a sub-mount.

The conductor traces enable to reach a mounting area for the optoelectronic component, which is above the mounting area for the TEC as seen from the base part.

Due to the freedom of design when providing a conductor trace on a dielectric, in particular ceramic sub-mount, it is possible to optimize the impedance characteristic as far as to the mounting area of the optoelectronic component.

Since both of the conductor traces serving as signal traces are arranged on a single support, it is possible to make the TO housing particularly compact, in particular to provide a TO-56 housing with a sufficiently large installation space for a TEC and a laser chip.

Furthermore, as preferably only a single support is provided, which extends vertically from the upper surface of the base part, this allows for a particularly simple manufacturing of the TO housing. In particular, the latter can be produced by stamping.

The two conductor traces in particular extend to a lateral end face of the support along an angle. In particular, the conductor traces are substantially L-shaped, one end of the conductor traces being connected to the connection pins of the feedthroughs and the other end of the conductor traces at an angle thereto is used to connect the optoelectronic component. In this way, it is in particular possible to provide two connection areas for the optoelectronic component, which are disposed above each other and above the mounting area of the thermoelectric cooler.

In one embodiment of the invention, at least one ground conductor trace is arranged between the conductor traces. This allows, on the one hand, to control the impedance characteristic, on the other hand to reduce crosstalk between the conductor traces.

According to another embodiment of the invention, a further ground conductor trace is arranged adjacent to the conductor trace, above and/or below at least one connection area for the optoelectronic component. This further ground conductor trace may be used for shielding purposes and/or for connecting the optoelectronic component to a ground conductor.

The ground conductor traces of the sub-mount are preferably electrically connected to the support via electrical through-holes that extend through the sub-mount.

In a refinement of the invention, the sub-mount for the ground conductor traces has openings, in particular through-holes with metallized side walls, in particular gold-plated side walls. The metallized through-holes, in particular coated or filled through-holes, connect the ground conductor traces to the support.

This arrangement provides shielding extending into the sub-mount, which further reduces the crosstalk between the conductor traces.

According to one embodiment, the support has a plate-like shape.

According to one embodiment of the invention, the support is formed integrally with the base part. In particular it is possible for the support to be stamped together with the base part, for example by stamping a T-shaped profile. Furthermore, a raw material with a thickness of at least the thickness of the base part and the support together may be used for stamping. From such a raw material, an integral component consisting of the base part and the support can be stamped or formed.

According to another embodiment of the invention, the support is applied to the base part, in particular by welding or soldering.

The invention permits to provide a TO housing in which the signal paths for connecting the optoelectronic component and consisting of the feedthroughs and the conductor traces have an impedance from 20 to 30Ω, in particular of about 25Ω. The signal paths are defined starting at the connection point at the connection pin extending out of the TO housing extending to the connection point of the optoelectronic component, in particular the DFB laser.

The impedance of the signal paths is preferably matched to the impedance of an electronic circuit connected to the TO housing, in particular a driver circuit. More particularly, the impedance of the signal paths corresponds to the impedance of the electronic circuit plus/minus 5Ω.

The electronic circuit is connected outside of the TO housing, via the connection pins. The signal paths extend from the connection point of the electronic circuit via the connection pins and conductor traces to the connected electronic component. The electronic circuit itself preferably has an impedance between 20 and 30Ω.

It will be understood that the impedance is a function of frequency. Impedance in the sense of the invention is understood to be the impedance in the high-frequency range in which the components are usually operated or signals thereof are to be processed.

The invention in particular relates to TO housings which are used for the GHz range. Data rates of 5 Gbit/s or more, in particular of more than 20 Gbit/s can be achieved.

According to one embodiment of the invention, the support has a height between 2.0 and 3.5 mm and/or a thickness between 0.3 and 1 mm and/or a width between 1.0 and 2.0 mm.

Preferably, the base part has a diameter between 5 and 7 mm and/or a thickness between 0.5 and 2.5 mm. Preferably, the diameter of the base part is less than 6.5 mm. The base part is preferably designed as a substantially circular base body.

Preferably, the base part, the support, and/or the connection pins are coated, in particular gold-plated.

The mounting area for the TEC is preferably located in a central region of the upper surface of the base part, and a support for a conductor trace for connecting the optoelectronic component is located only on one side of the mounting area.

In particular, the mounting area for the TEC is located centrally, but not exactly in the center, the mounting area being offset from the center as viewed from the support towards the opposite side to provide space for the support. In this way it is possible to provide a compact arrangement in which the chip of the optoelectronic component can be arranged substantially on a central axis of the TO housing.

The invention furthermore relates to a TO housing which is equipped with a thermoelectric cooler and an optoelectronic component.

The TEC is arranged on the base part. In this case, a sub-mount with the optoelectronic component extends beyond the TEC perpendicular to the upper surface of the base part. That means, the sub-mount is aligned vertically, while the upper surface of the base part defines the horizontal plane in the sense of the invention. The sub-mount with the conductor traces is arranged so as to adjoin this sub-mount with the optoelectronic component. The sub-mount with the conductor traces is also aligned vertically.

Thus, the connection areas of the two sub-mounts can be arranged close to each other, especially if the two sub-mounts are aligned substantially along the same plane.

According to a preferred embodiment, the conductor traces of the support are connected to conductor traces of an optoelectronic component or of the sub-mount of an optoelectronic component by means of bonding wires.

Due to the adjoining connection areas it is possible to keep the length of the bonding wires particularly small, which improves the impedance characteristic. In particular, the bonding wires may have a length of less than 1 mm, preferably less than 0.5 mm.

In a preferred embodiment of the invention, the thermoelectric cooler has an L-shaped portion. In this case, the sub-mount with the optoelectronic component is arranged on a surface of the L-shaped thermoelectric cooler, which is oriented perpendicularly to the upper surface of the base part.

Thus, according to this embodiment, the thermoelectric cooler has the shape of an angle, for providing a mounting area for the sub-mount of the optoelectronic component, and the sub-mount is arranged on the vertically aligned leg of the angle.

The invention furthermore relates to a method for producing a TO housing as described above. According to the invention, both the base part and the support are stamped. More particularly, the base part and the support are stamped out of a metal sheet.

According to one embodiment of the invention, the base part and the support are stamped out of a single piece of raw material. This may in particular be achieved by using a raw material with T-shaped profile or by using a plate-like raw material with a thickness corresponding to at least the height of the base part and the support, as already mentioned above.

The invention furthermore relates to a sub-mount for a TO housing, which sub-mount comprises at least two conductor traces serving as signal conductors and extending from a first side of the sub-mount to a second side of the sub-mount perpendicular thereto, wherein a ground conductor trace is arranged between the two conductor traces.

Thus, the sub-mount is designed such that the signal conductors are routed from one edge of the sub-mount to another edge perpendicular thereto, in particular a vertical edge of the sub-mount. In this way it is in particular possible to obtain a mounting area for an optoelectronic component which is spaced apart from the surface on which the sub-mount is mounted, due to a thermoelectric cooler.

Otherwise, the sub-mount is preferably formed as described above.

The invention furthermore relates to a sub-mount for the TO housing described above, which is equipped with an optoelectronic component, in particular a DFB laser.

The sub-mount has a first conductor trace near an edge thereof, which defines a peripheral connection area. This conductor trace may in particular be connected, by means of a bonding wire, to a directly adjoining sub-mount supporting the signal conductor traces.

The peripheral connection area is surrounded on its other sides by a ground conductor trace. More particularly, the connection area is enclosed by a U-shaped or annular ground conductor trace.

Therefore, it is only at the edge that the connection area is not surrounded by a ground conductor trace.

Furthermore, the sub-mount comprises a second conductor trace which extends from the edge to the optoelectronic component. The optoelectronic component may in particular be directly mounted on and at the same time be electrically connected to the second conductor trace.

The first conductor trace is connected to the optoelectronic component by a bonding wire. The bonding wire may span the second conductor trace.

By using the sub-mount, it is possible in a simple manner to provide a design where the connection areas of two conductor traces serving as signal conductors are located directly adjacent to an edge of the sub-mount. Bonding wires which are used to connect the sub-mount can be made particularly short in this way.

The invention furthermore relates to a TO housing which is equipped with at least one of the sub-mounts described above, preferably with both sub-mounts. The TO housing is in particular configured as described above. The housing is preferably round and comprises a base part in the form of a header and a cap. However, the housing may as well be a different TO housing, in particular a butterfly type or box package type TO housing.

BRIEF DESCRIPTION OF THE DRAWINGS

The subject-matter of the invention will now be explained in more detail by way of an exemplary embodiment as illustrated in the drawings of FIGS. 1 to 4.

DETAILED DESCRIPTION

Figure 1:
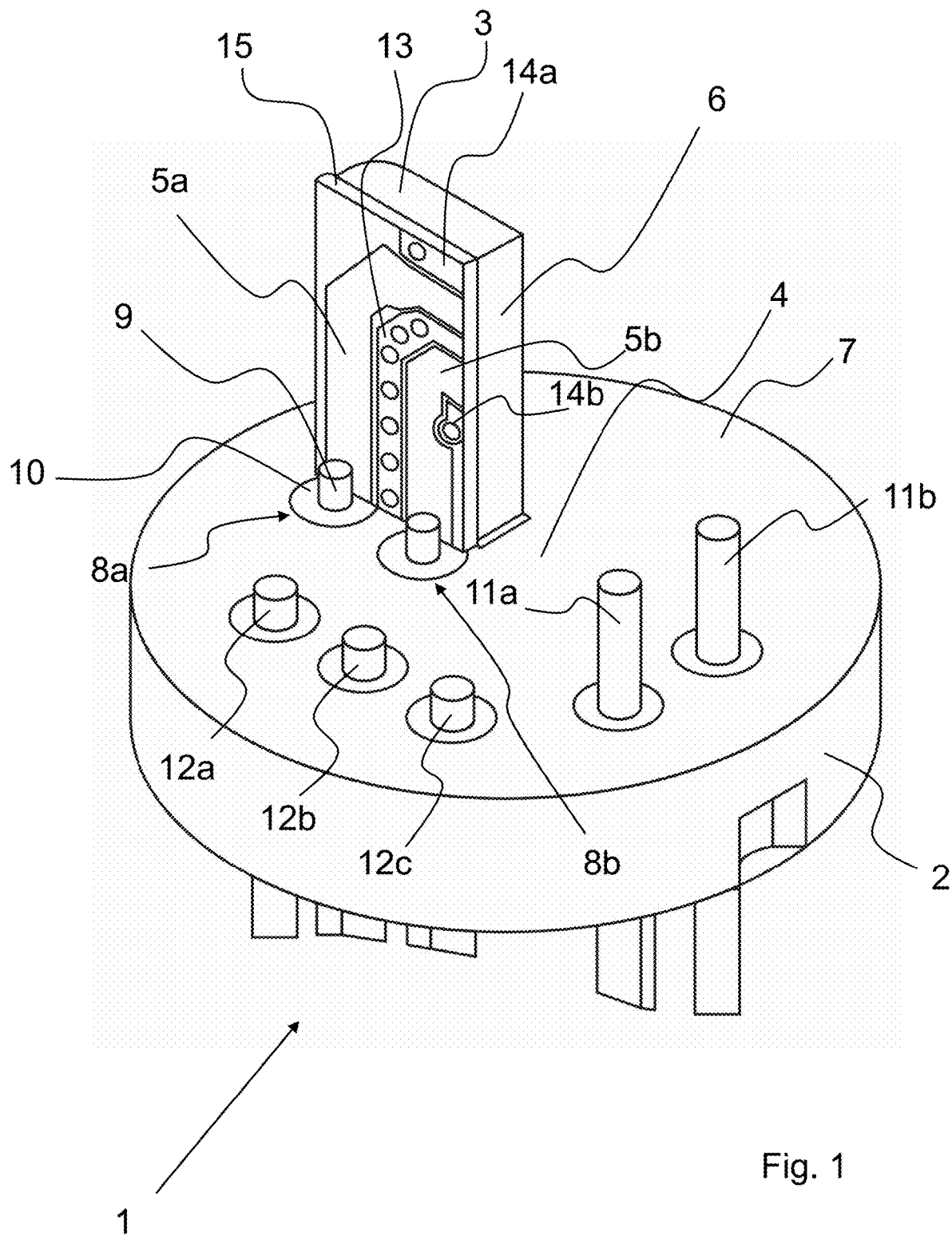
FIG. 1 is a perspective view of a TO housing according to the invention.

FIG. 1 is a perspective view of a TO housing 1 according to a preferred exemplary embodiment of the invention.

It will be understood that the completed TO housing will additionally be provided with a cap that includes a window. The cap is not illustrated in this view, nor in the further views.

TO housing 1 comprises a stamped base part 2 having an upper surface 7 from which the support 3 protrudes, which is provided with the conductor traces 5a and 5b that are used as signal conductor traces.

Base part 2 and support 3 may have a plate-like shape. In particular, base part 2 and support 3 may be produced by stamping.

Base part 2 and/or support 3 are made of a metal, in particular a steel.

Preferably, base part 2, support 3, and the connection pins 9, 12a to 12c, 11a to 11b are coated, in particular gold-plated.

Support 3 is arranged on the upper surface 7 of base part 2 offset from a central axis thereof and projects vertically upwards.

A lateral end face 6 of the support 3 substantially faces the central axis of base part 2.

In the present exemplary embodiment, a sub-mount 15 is arranged on a front side of support 3, which sub-mount is made of a dielectric material, in particular a ceramic sub-mount 15, on which the conductor traces 5a and 5b are arranged, which serve as signal conductor traces for the optoelectronic component.

Conductor traces 5a and 5b are routed along an angle.

Conductor traces 5a and 5b are connected to the feedthroughs 8a and 8b.

Feedthroughs 8a and 8b as well as the further feedthroughs consist of a connection pin 9 accommodated in a glass seal 10 which hermetically seals the TO housing 1.

Next to the support 3, a mounting area 4 for a thermoelectric cooler is provided on the upper surface 7 of the base part 2.

The angled conductor traces 5a and 5b extend from the connection pins 9 (RF pins) to the end face 6 of the support 3 in an area above this mounting area 4, which area in turn serves as a mounting area (23 in FIG. 2) for the optoelectronic component.

Furthermore, a ground conductor 13 is located between the conductor traces 5a and 5b, which is also provided in the form of a conductor trace on sub-mount 15.

Sub-mount 15 is preferably provided in the form of a ceramic plate with a thickness of preferably less than 0.3 mm.

Above and below the component-side ends of the conductor traces 5a and 5b, a respective ground conductor 14a, 14b is located, which serves as a shield and which can be connected to the sub-mount of the optoelectronic component (19 in FIG. 2).

Conductor traces 5a, 5b and ground conductor traces 13, 14a, 14b are provided in the form of a metal layer, in particular a gold-containing metal layer, for example as a gold-nickel layer.

The signal paths to the optoelectronic component are defined by the connection pins 9, the conductor traces 5a, 5b, and the bonding wires and conductor traces on the sub-mount of the thermoelectric component (not illustrated here).

The signal paths preferably have an impedance of 20 to 30Ω within the high frequency range.

In addition to connection pins 9, the housing of this exemplary embodiment furthermore comprises the three connection pins 12a to 12c arranged in a row, which are used, for example, to connect a thermoelectric cooler (DC pins).

Figure 2:
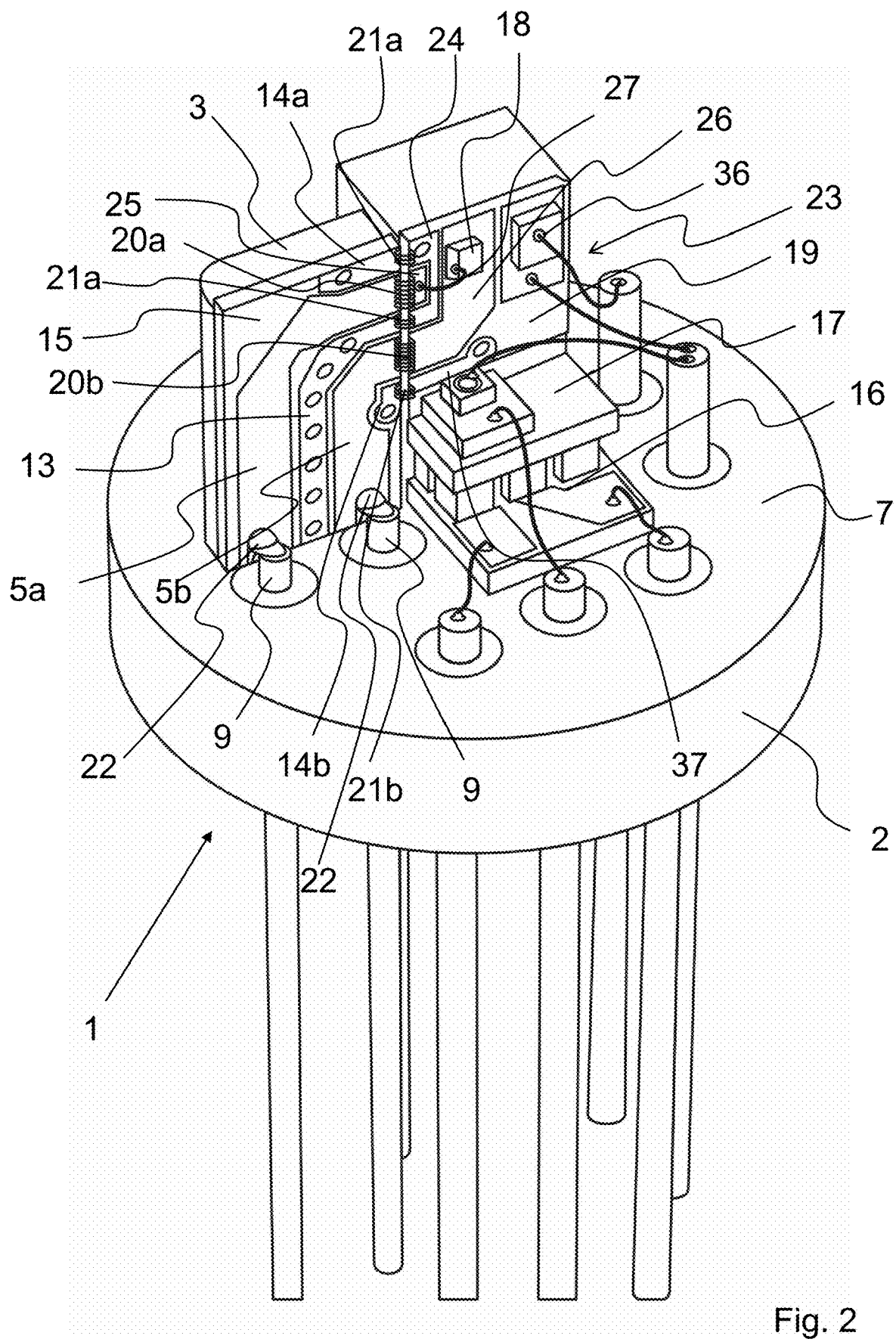
FIG. 2 is a perspective view of the TO housing equipped with the optoelectronic component and the TEC.

Connection pins 11a to 11b opposite the support 3 are projecting further upwards than the connection pins 12a to 12c and are used in particular for connecting a thermistor which is arranged on the sub-mount of the optoelectronic component (19 in FIG. 2).

The feedthroughs of connection pins 11a to 11b and 12a to 12c also include a glass seal.

FIG. 2 shows the equipped TO housing, again in a perspective view.

A thermoelectric cooler 16 is mounted on the upper surface 7 of the base part. Thermoelectric cooler 16 has an L-shaped portion 17. The mounting area 23 for the optoelectronic component is located above the lower leg of L-shaped portion 17.

The optoelectronic component is a DFB laser diode 18.

DFB laser diode 18 sits on a ceramic sub-mount 19 which is aligned vertically and preferably arranged substantially centrally in the TO housing 1.

For this purpose, the sub-mount 19 is applied to the vertical leg of L-shaped portion 17.

Next to the DFB laser diode 18, a thermistor 36 is arranged, which is used to control the thermoelectric cooler 16.

Conductor traces 5a, 5b of support 3 are connected to the connection pins 9 by a solder 22, in particular by a gold-tin solder.

The sub-mount 15 of conductor traces 5a, 5b and the sub-mount 19 of the optoelectronic component are aligned in a plane such that conductor traces 5, 5b and 25, 26 thereof are directly facing each other. The conductor traces 5a, 5b which are used as signal conductor traces are connected to the conductor traces 25 and 26 of the sub-mount 19 of the DFB laser diode 18 by a plurality of bonding wires 20a, 20b, preferably gold bonding wires.

Conductor trace 26 leads directly to the DFB laser diode 18.

Below conductor trace 26, the ground conductor trace 14b is connected to a ground conductor trace 37 on the sub-mount 19 of the DFB laser diode 18 by bonding wires 21b.

A ground conductor trace 24 which is connected, by bonding wires 21a, to the ground conductor trace 14a and to the conductor trace 13 lying between conductor traces 5a and 5b, encloses the conductor trace 25 which is used as a signal conductor trace on the sub-mount 19 of the DFB laser diode 18. In this manner, conductor trace 25 is also shielded.

Conductor trace 25 is connected to the DFB laser diode 18 by a bonding wire 27.

Figure 3:
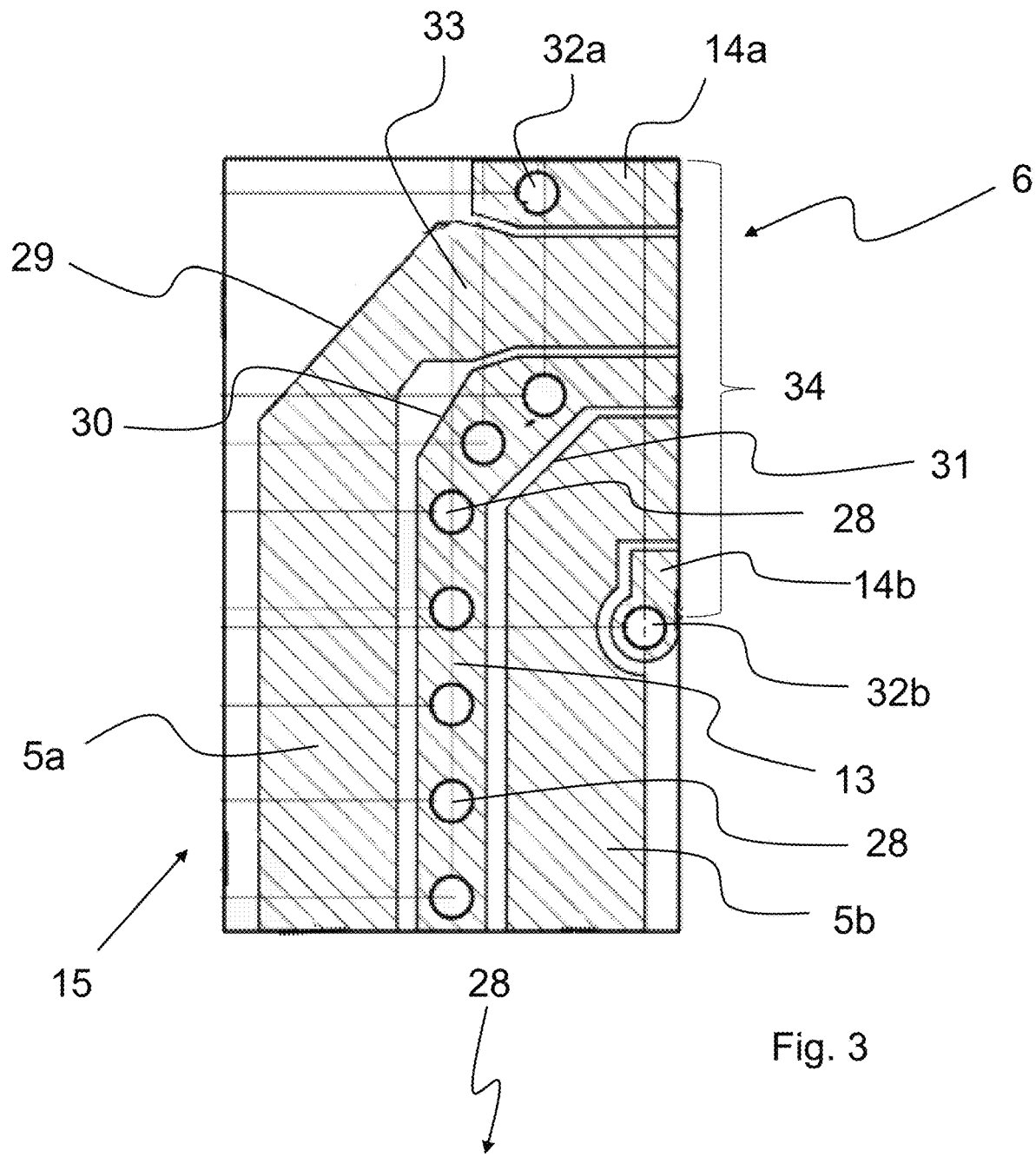
FIG. 3 is a detailed view of the sub-mount arranged on a support, the sub-mount having the conductor traces that lead to the mounting area of the optoelectronic component.

FIG. 3 is a plan view of sub-mount 15 which is used to route the conductor traces 5a and 5b that serve as signal conductor traces to the mounting area (23 in FIG. 2) of the optical component.

Sub-mount 15 is preferably made of a ceramic, and the conductor traces 5a and 5b are preferably made of gold or a gold-containing alloy.

Conductor traces 5a and 5b are used to extend the signal path coming from the connection pins that are extended through the base part of the TO housing, upwards and towards the center of the housing.

For this purpose, conductor traces 5a and 5b are routed along an angle.

The connection area 34 for the optoelectronic component leads towards a lateral end face 6 of the sub-mount 15 or of the support with sub-mount 15.

In connection area 34, the conductor traces 5a and 5b and the ground conductor traces 14a, 13, and 14b can be connected to the sub-mount of the optoelectronic component, by bonding wires.

Within the range of ground conductor trace 13, which is arranged between conductor traces 5a and 5b and has a smaller width than the conductor traces 5a and 5b, there are a plurality of through-holes 28, preferably at least five, which have metallized side walls thereby providing a shielding which extends through the sub-mount 15. Metallized through-holes 28 are used to electrically connect the ground conductor trace to the support.

The corner region 30 of the middle ground conductor trace 13 is chamfered and has an enlarged width. This avoids sharp edges and the associated signal loss.

The corner regions 31 and 29 of conductor traces 5a and 5b are cut off at the edge so that the width of conductor traces 5a and 5b is reduced in the respective corner region 31, 29.

Conductor trace 5a includes an enlarged area 33 between corner region 29 and connection area 34. This serves to tune the impedance profile of the signal path.

The ground conductor traces 14a and 14b above and below the connection area of conductor traces 5a and 5b serve to shield the conductor traces 5a and 5b on the one hand, and on the other hand for connection to the sub-mount of the optical component.

Ground conductor traces 14a and 14b each have at least one, preferably exactly one through-hole 32a, 32b with metallized side walls, thereby connecting the ground conductor traces 14a and 14b to the support.

Figure 4:
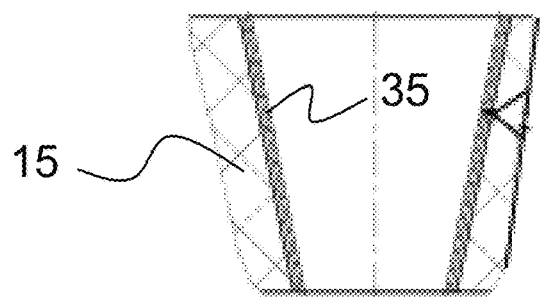
FIG. 4 is a schematic sectional view of a detail in the region of a through hole of a sub-mount.

FIG. 4 is a sectional view through one of the through-holes 28 of a ground conductor trace.

Through-hole 28 which is formed into the sub-mount 15, in particular etched, has inclined side walls. More particularly, the through-hole 28 has a frusto-conical shape with a cone angle from 5 to 90°, preferably from 20 to 40°. The side walls are provided with a metal layer 35, in particular with a gold-containing metal layer 35. Metallization within the meaning of the invention also refers to complete filling of the openings, in particular through-holes 28.

By using the sub-mount shown in FIGS. 3 and 4, it was possible to achieve an impedance of approximately 25Ω of the signal path starting form a connected driver circuit and extending as far as to an electronic component.

The TO housing of the invention enables high transmission rates in the high-frequency range when using DFB laser diodes. At the same time, the TO housing is robust and easy to manufacture.

| LIST OF REFERENCE NUMERALS | |
|---|---|
| 1 | TO housing |
| 2 | Base part |
| 3 | Support |
| 4 | Mounting area |
| 5a, 5b | Conductor traces |
| 6 | End face |
| 7 | Upper surface |
| 8a, 8b | Feedthrough |

-continued

LIST OF REFERENCE NUMERALS

| | |
|---|---|
| 9 | Connection pin |
| 10 | Glass seal |
| 11a-11c | Connection pin |
| 12a-12c | Connection pin |
| 13 | Ground conductor trace |
| 14a, 14b | Ground conductor trace |
| 15 | Sub-mount |
| 16 | TEC |
| 17 | L-shaped portion |
| 18 | DFB laser diode |
| 19 | Sub-mount |
| 20a, 20b | Bonding wires |
| 21a, 21b | Bonding wires |
| 22 | Solder |
| 23 | Mounting area |
| 24 | Ground conductor trace |
| 25 | Conductor trace |
| 26 | Conductor trace |
| 27 | Bonding wire |
| 28 | Through-hole |
| 29 | Corner region |
| 30 | Corner region |
| 31 | Corner region |
| 32a, 32b | Through-hole |
| 33 | Enlargement |
| 34 | Connection area |
| 35 | Metal layer |
| 36 | Thermistor |

What is claimed is:

1. A transistor outline housing for connecting to an optoelectronic component, comprising:
a base part having an upper surface, the upper surface having a cooler mounting area;
two feedthroughs configured to be connected to the optoelectronic component;
a support that extends from the upper surface of the base part, wherein the support has two conductor traces arranged thereon, each of the two conductor traces being connected to a respective one of the two feedthroughs; and
a ground conductor trace arranged on the support between the two conductor traces
a trace sub-mount on a front side of the support, a thermoelectric cooler, the optoelectronic component, and a component sub-mount,
wherein the thermoelectric cooler is arranged on the cooler mounting area of the base part, the component sub-mount extending above at least portions of the thermoelectric cooler and extending perpendicular to the upper surface of the base part, and
wherein the component sub-mount adjoins the trace sub-mount.

2. The TO housing of claim 1, wherein the housing is a TO-56 style housing.

3. The TO housing of claim 1, further comprising the optoelectronic component connected to the two feedthroughs.

4. The TO housing of claim 1, wherein the two conductor traces extend along an angle to a lateral end face of the support.

5. The TO housing of claim 1, further comprising a trace sub-mount on a front side of the support, the two conductor traces being disposed on the trace sub-mount.

6. The TO housing of claim 5, wherein the trace sub-mount has through-holes with side walls that are metallized.

7. The TO housing of claim 1, wherein the two feedthroughs and the two conductor traces define signal paths having an impedance from 20 to 30Ω each.

8. The TO housing of claim 1, wherein the support has at least one of a height between 2.0 and 3.5 mm, a thickness between 0.3 and 1 mm, and a width between 1.0 and 2.0 mm, and/or wherein the base part has at least one of a diameter between 5 and 7 mm and a thickness between 0.5 and 2.5 mm.

9. The TO housing of claim 1, wherein the base part and the support are gold-plated.

10. The TO housing of claim 1, wherein the cooler mounting area in a central region of the upper surface of the base part and wherein the support is provided only on one side of the cooler mounting area.

11. The TO housing of claim 1, wherein the optoelectronic component is a DFB laser.

12. The TO housing of claim 1, wherein the thermoelectric cooler has an L-shaped portion, wherein the component sub-mount is arranged on a surface of the L-shaped thermoelectric cooler, the surface being oriented perpendicularly to the upper surface of the base part.

13. The TO housing of claim 1, wherein the component sub-mount is connected to the trace sub-mount by bonding wires.

14. The TO housing of claim 13, wherein the bonding wires have a length of less than 1 mm each.

15. The TO housing of claim 1, further comprising a driver circuit connected to the two feedthroughs, wherein the driver circuit has an impedance from 20 to 30Ω.

16. The TO housing of claim 1, wherein the base part and the support are stamped as a single piece.

17. The TO housing of claim 1, wherein the base part and the support are each stamped parts that are joined to each other soldering or welding.

18. A transistor outline housing for connecting to an optoelectronic component, comprising:
a base part having an upper surface, the upper surface having a cooler mounting area;
two feedthroughs configured to connect to the optoelectronic component;
a support that extends from the upper surface of the base part, wherein the support has two conductor traces arranged thereon, each of the two conductor traces being connected to a respective one of the two feedthroughs;
a ground conductor trace arranged between the two conductor traces; and
a trace sub-mount on a front side of the support, the two conductor traces being disposed on the trace sub-mount, wherein the trace sub-mount has through-holes with side walls that are metallized.

19. A transistor outline housing for connecting to an optoelectronic component, comprising:
a base part having an upper surface, the upper surface having a cooler mounting area;
two feedthroughs configured to connect to the optoelectronic component; and
a support that extends from the upper surface of the base part, wherein the support has two conductor traces arranged thereon, each of the two conductor traces being connected to a respective one of the two feedthroughs, wherein the cooler mounting area in a central region of the upper surface of the base part and wherein the support is provided only on one side of the cooler mounting area.

* * * * *